(12) United States Patent
Hsu et al.

(10) Patent No.: US 6,490,196 B1
(45) Date of Patent: Dec. 3, 2002

(54) METHOD FOR OPERATING A NONVOLATILE MEMORY HAVING EMBEDDED WORD LINES

(75) Inventors: Ching-Hsiang Hsu, Hsin-Chu (TW); Kung-Hong Lee, Tung-Kang (TW); Ching-Sung Yang, Hsi-Hu (TW)

(73) Assignee: eMemory Technology Inc., Hsin-Chu (TW)

( * ) Notice: Subject to any disclaimer, the term of this patent is extended or adjusted under 35 U.S.C. 154(b) by 0 days.

(21) Appl. No.: 10/064,047

(22) Filed: Jun. 4, 2002

Related U.S. Application Data

(62) Division of application No. 09/683,212, filed on Dec. 3, 2001, now Pat. No. 6,448,607.

(30) Foreign Application Priority Data

Dec. 8, 2000 (TW) ........................ 89126176 A

(51) Int. Cl.[7] ........................ G11C 16/04; H01L 29/788
(52) U.S. Cl. ........................ 365/185.03; 365/185.18; 257/316; 257/317
(58) Field of Search ........................ 365/185.03, 185.1, 365/185.18, 185.21, 185.28, 185.29; 257/315, 316, 317

(56) References Cited

U.S. PATENT DOCUMENTS

| 5,016,068 A | * | 5/1991 | Mori | 257/317 |
| 5,990,509 A | * | 11/1999 | Burns et al. | 257/316 |
| 6,130,453 A | * | 10/2000 | Mei et al. | 257/315 |
| 6,143,636 A | * | 11/2000 | Forbes et al. | 257/315 |
| 6,204,123 B1 | * | 3/2001 | Mori | 257/316 |

* cited by examiner

*Primary Examiner*—Son Mai
(74) *Attorney, Agent, or Firm*—Winston Hsu

(57) ABSTRACT

A flash memory cell with an embedded gate structure capable of storing two bits of information and the operation of such a flash memory cell are provided. A first ion-doped region, serving as a source terminal, is formed in a semiconductor substrate. An embedded gate structure and a second ion-doped region are alternately arranged on the first ion-doped region. The embedded gate structure is surrounded by the first oxide layer, the trapping layer, and the second oxide layer. An insulating layer is formed on the embedded gate structure. A diffusion drain is positioned atop the second ion-doped region and a conductive layer connects with the diffusion drains. The embedded gate structure is isolated from the diffusion drain with the insulating layer. Furthermore, the reading, programming, and erasing operation of the memory cell with two bits of information are provided.

4 Claims, 8 Drawing Sheets

METHOD FOR OPERATING A NONVOLATILE MEMORY HAVING EMBEDDED WORD LINES

CROSS REFERENCE TO RELATED APPLICATIONS

This application is a division of application Ser. No. 09/683,212 filed on Dec. 3, 2001, U.S. Pat. No. 6,448,607.

BACKGROUND OF INVENTION

1. Field of the Invention

The present invention relates to a method for operating a non-volatile memory, and more particularly, to a method of programming, reading, and erasing a flash memory having embedded word lines.

2. Description of the Prior Art

Flash memories have the property of being electrically programmable and erasable, and because of their usefulness, they are widely applied in electronic products such as portable computers and communication equipment. In general, flash memory cells can be divided into two types: a stacked gate type and a split gate type, according to the structure of their gates.

Flash memory cells of both stacked gate type and split gate type are arranged in an array, and each memory cell usually stores one bit of information. In each memory cell, a source and a drain are formed in an n-type or a p-type silicon substrate. A tunneling dielectric layer is formed between the source and the drain. A floating gate and a controlling gate, separated by an insulating layer, are formed on the tunneling dielectric layer. The floating gate is used for storing an electrical charge and the controlling gate is used to control the accessing and storing of information. Additionally, memory cells are isolated from one another by field oxide layers or shallow trench isolation. In order to enhance the efficiency of the programming and erasing of flash memories, a memory cell with a larger area for the purpose of obtaining a high coupling ratio is required. However, a memory cell with too large of an area is difficult to integrate with other components.

Thus, the memory cell disclosed in U.S. Pat. No. 6,011, 725 attempts to solve the above-mentioned problem. The memory cell uses an electrically erasable programmable ROM (EEPROM) as an example. As shown in FIG. 1, in a memory cell with two binary bits of information, a source 12 and a drain 14 are formed in a semiconductor substrate 10. A channel 16 is positioned in the semiconductor substrate 10 between the source 12 and the drain 14. A silicon oxide layer 18, a trapping layer 20 (such as silicon nitride), and a silicon oxide layer 22 are sequentially formed on the semiconductor substrate 10. A gate 24 is positioned on the silicon oxide layer 22. The memory cell is programmed by hot electron injection. Using the right bit as an example, when grounding the source 12 and applying a voltage on the gate 24 and the drain 14, electrons are sped up and gain sufficient energy to inject into a region of the trapping layer 20 close to the drain 14. When reading the right bit, a large enough voltage is applied to the gate 24 and the source 12. That is, reading and programming are performed in opposite directions for each bit in the memory cell.

The above-mentioned flash memory has an advantage that each memory cell stores two bits of information. However, reading and programming are performed in opposite directions for each bit. That is, as shown in FIG. 1, when reading the right bit, the drain 14 serves as a source terminal and the source 12 serves as a drain terminal. When reading the left bit, the drain 14 serves as a drain terminal and the source 12 serves as a source terminal. The read method accomplished by alternating the source and the drain increases the complexity and the total area of periphery circuits. That is, the above-mentioned flash memory enhances the integration of the memory cells, however, it also increases the total area of periphery circuits.

SUMMARY OF INVENTION

It is therefore a primary objective of the claimed invention to provide a method of programming, reading, and erasing a flash memory having embedded word lines and a sandwich structure comprising a first oxide layer, a trapping layer and a second oxide layer. The flash memory will not alternate the source and the diffusion drain when reading the left bit and the right bit of a flash memory cell.

It is another objective of the claimed invention that the embedded gate structure utilized in the claimed invention effectively reduces the total area of the memory cells and simplifies the periphery circuits. Thus, the memory cell capable of storing two bits of information in the claimed invention satisfies requirements for high density memories.

According to the claimed invention, the flash memory cell comprises an N-type well implanted in a substrate. A P-type well and an embedded gate structure are alternatively arranged on the N-type well. An N-type doped region, serving as a source terminal, is positioned beneath the embedded gate structure. A diffusion drain is positioned on the P-type well and a conductive layer connects with the diffusion drains. The embedded gate structure comprises a gate, a first oxide layer, a trapping layer, and a second oxide layer, wherein the gate is surrounded by the first oxide layer, the trapping layer, and the second oxide layer. In addition, an insulating layer is formed on the embedded gate structure. A left bit and a right bit are formed in the trapping layer of the left and right sides of the embedded gate structure. The above-mentioned structure of the memory cell is used to perform the reading, programming, and erasing operation of the left bit and the right bit.

It is an advantage against the prior art that complexity and total areas of periphery circuits are effectively reduced. In addition, an array of many two bit flash memory cells of the claimed invention does not require field oxide layers or shallow trench isolation. Furthermore, the claimed invention has the advantages of simple fabrication, high density, and small area.

These and other objectives of the claimed invention will no doubt become obvious to those of ordinary skill in the art after reading the following detailed description of the preferred embodiment, which is illustrated in the multiple figures and drawings.

DETAILED DESCRIPTION

The present invention provides a flash memory cell capable of storing two bits of information that utilizes embedded word lines and non-conductive dielectric layers.

Figure 1:
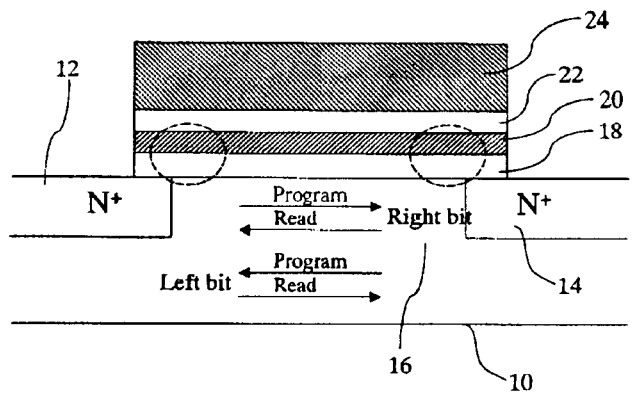
FIG. 1 is a schematic diagram depicting the structure of an electrically erasable programmable ROM according to the prior art.
Figure 2:
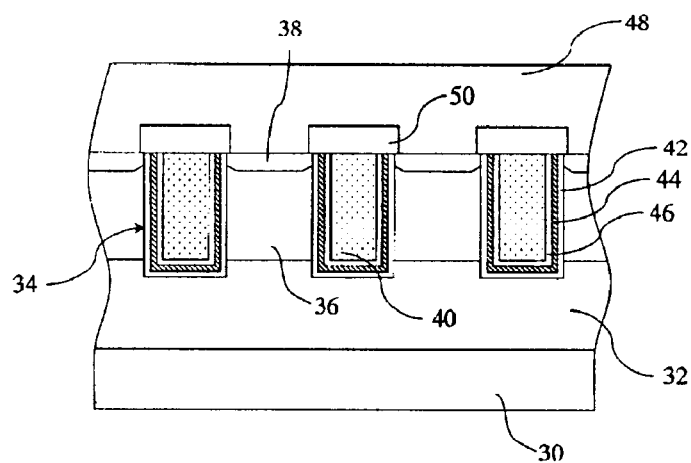
FIG. 2 is a schematic diagram depicting the structure of the memory cells according to present invention.

A schematic diagram illustrating the structure of flash memory cells is shown in FIG. 2. An ion implantation process is performed in a P-type semiconductor substrate 30 to form a first ion-doped region. The first ion-doped region is a second well 32 with an N-type dopant serving as a source terminal. An embedded gate structure 34, serving as word lines, and a second ion-doped region are alternately arranged on the surface of the second well 32. The second ion-doped region is a first well 36 with a P-type dopant, and a diffusion drain 38 with an N-type dopant is formed on the first well 36. The embedded gate structure 34 comprises a conductive layer 40, serving as a gate, and a non-conductive dielectric layer surrounding the conductive layer 40. The non-conductive dielectric layer is an ONO film (oxide-nitride-oxide film). The ONO film comprises a first oxide layer 42, a trapping layer 44, usually comprising silicon nitride, and a second oxide layer 46. The trapping layer 44 is a charge-trapping region for trapping electrons or holes injected into the ONO film. Additionally, another conductive layer 48, such as a doped polysilicon, serves as a bit line and connects with the diffusion drains 38. The conductive layer 48 is isolated from the embedded gate structure 34 by an insulating layer 50, thus preventing interference of voltages between the conductive layer 48 and the embedded gate structure 34. The first wells 36 are isolated from one another by the embedded gate structure 34 and the second well 32.

Figure 3:
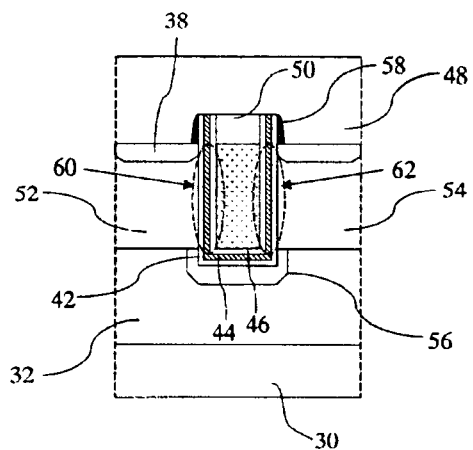
FIG. 3 is a schematic diagram depicting the structure of a memory cell according to present invention.

Please refer to FIG. 3. A flash memory cell comprises a second well 32 implanted in a P-type semiconductor substrate 30. A first P-type well 52, an embedded gate structure 34, and a second P-type well 54 are arranged in parallel on the second well 32. An N-type doped region 56, serving as a source terminal, is located beneath the embedded gate structure 34. Diffusion drains 38 with N-type dopants are formed on the first P-type well 52 and the second P-type well 54, and a conductive layer 48 connects the diffusion drains 38. A pair of spacers 58 is formed on sidewalls of the embedded gate structure 34. The spacers 58 are formed in the conductive layer 48 and above the diffusion drains 38, and are utilized to isolate the embedded gate structure 34 from the conductive layer 48. The embedded gate structure 34 comprises a conductive layer 40, serving as a gate, a first oxide layer 42, a trapping layer 44, and a second oxide layer 46, wherein the conductive layer 40 is surrounded by the first oxide layer 42, the trapping layer 44, and the second oxide layer 46. In addition, an insulating layer 50 is formed on the conductive layer 40. Portions of the trapping layer 44 located on the right and left sides of the embedded gate structure 34 are charge-trapping regions for storing a left bit 60 and a right bit 62, respectively, thus forming a flash memory cell capable of storing two bits of information.

Operation of the two bit flash memory disclosed in the present invention is described as follows and illustrated in FIG. 4. A source voltage $V_S$, a bit line voltage $V_{BL}$, and a word line voltage $V_{WL}$ are applied on the source, the drain and the gate of the flash memory cell, respectively. Also, a first P-type well voltage $V_{PW1}$ and a second P-type well voltage $V_{PW2}$ are applied on the first P-type well and the second P-type well, respectively. As a result, the flash memory cell is capable of being read, programmed, and erased.

Figure 4A:
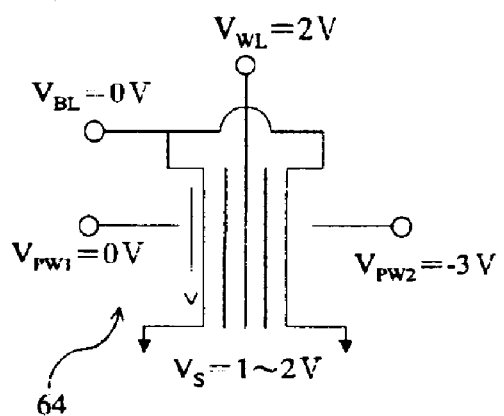
FIG. 4A and FIG. 4B are schematic diagrams of the present invention illustrating the reading operation for the left bit and the right bit.
Figure 4B:
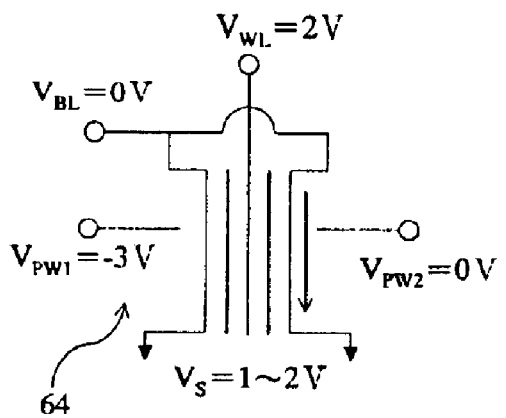

As shown in FIG. 4A and FIG. 4B, when reading the two bit flash memory cell 64, the word line voltage $V_{WL}$ of a positive voltage (such as 13 volt) is applied to the gate, the bit line is grounded, and the source voltage $V_S$ is a positive voltage lower than the word line voltage (such as 1~2 volt). As shown in FIG. 4A, when reading the left bit of the flash memory cell, the first P-type well is grounded (i.e. $V_{PW1}$=0) and a negative voltage between 1.5 volt and 3.0 volt is applied to the second P-type well, causing the right vertical channel of the right bit to be nonconductive due to the Body Effect. As shown in FIG. 4B, when reading the right bit of the flash memory cell, the first P-type well voltage $V_{PW1}$ is a negative voltage between 1.5 volt and 3.0 volt, and the second P-type well voltage $V_{PW2}$ is zero. The right bit and the left bit of the flash memory cell can be read by the method described above.

Figure 5A:
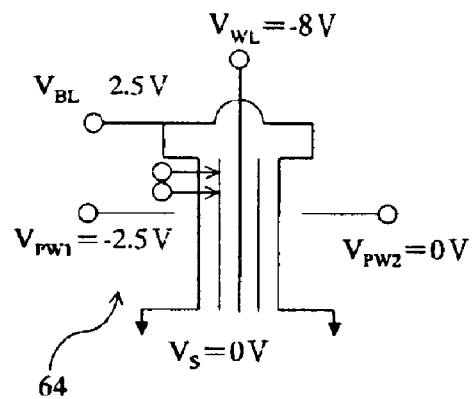
FIG. 5A and FIG. 5B are schematic diagrams of the present invention illustrating the programming and erasing operation for the left bit and the right bit.

FIG. 5A illustrates a programming operation of the two bit flash memory cell. Take the programming of the left bit for example, the bit line voltage $V_{BL}$ is a positive voltage between 1 volts and 4 volts (e.g. 2.5 volts), the source voltage $V_S$ is zero, and the first P-type well voltage $V_{PW1}$ is a large negative voltage (e.g. 2.5 volt) and induces the first P-type well and the diffusion drain to produce large band-to-band tunneling (BTBT) current. Meanwhile, a large negative word line voltage $V_{WL}$ (e.g. −8 volts) is applied to the gate. As a result, the hot holes pass through the first oxide layer 42 and are trapped in the charge-trapping region of the left bit 60 of the trapping layer 44. The programming of the left bit is completed. Because the second P-type well voltage $V_{PW2}$ is zero, the band-to-band tunneling (BTBT) current produced by the second P-type well and the diffusion drain is not large enough to program the right bit.

Figure 5B:
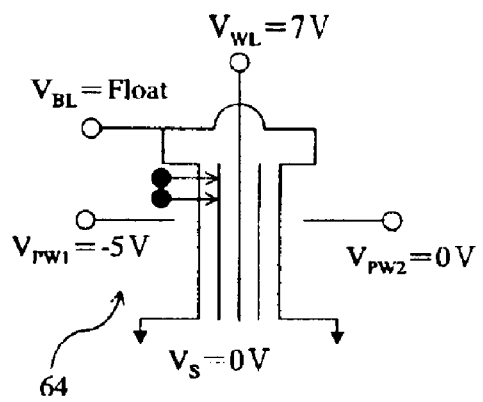

As shown in FIG. 5B, when erasing the left bit of the two bit flash memory cell, the bit line voltage $V_{BL}$ is float (i.e. $V_{BL}$ float), the source voltage $V_S$ is zero, and the word line voltage $V_{WL}$ is a large positive voltage (e.g. 7 volts). Thus, the left vertical channel of the flash memory cell is turned on and the voltage of the diffusion drain is the same as the source voltage $V_S$, i.e. $V_{BL}$=$V_S$=0 volts. Also, the first P-type well voltage $V_{PW1}$ is a large negative voltage (e.g. 5 volts). Under these conditions, band-to-band tunneling occurs in the left vertical channel, and hot electrons are attracted by the electric fields produced by the word line voltage $V_{WL}$, jump over the first oxide layer 42, and are trapped in the charge-trapping region of the left bit 60 of the trapping layer 44, where the hot holes are stored. Under such conditions, the hot electrons neutralize the holes stored in the charge-trapping region so that the left bit is erased. Because the second P-type well voltage $V_{PW2}$ is zero, the right bit is not erased.

Figure 6:
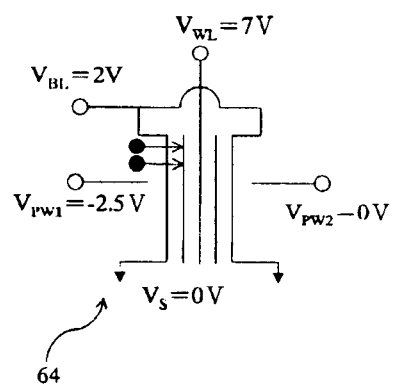
FIG. 6 is a schematic diagram of another embodiment of the present invention illustrating the erasing operation for the left bit.

Please refer to FIG. 6. In the above-mentioned erasing operation, the bit line voltage $V_{BL}$ can be a small positive voltage between 1.5 volts and 3.5 volts, and the word line voltage $V_{WL}$ is a large positive voltage (e.g. 7 volt). Thus, the left vertical channel of the flash memory cell is turned on. Electrons flow from the source, pass through the left vertical channel, and flow into the diffusion drain. At the same time, electrons are sped up by the bit line voltage $V_{BL}$ and become hot electrons. In contrast to general channel hot electron injection, the bit line voltage $V_{BL}$ is not large enough that the hot electrons have sufficient energy to jump the energy barrel of the first oxide layer 42. As a result, a negative voltage, $V_{PW1}=-2\sim-3.5$ volt, is applied to the first P-type well to induce a channel initiated secondary electron injection, completing the erasing operation.

In the above-mentioned programming and erasing operation, the left bit is used as an example. When performing programming and erasing operations on the right bit, the source voltage $V_S$, the bit line voltage $V_{BL}$, and the word line voltage $V_{WL}$ are the same as those used in the programming and erasing operation of the left bit. The first P-type well voltage $V_{PW1}$ is the same as the second P-type well voltage $V_{PW1}$ used in the programming and erasing operation of the left bit. The second P-type well voltage $V_{PW2}$ is the same as the first P-type well voltage $V_{PW1}$ used in the programming and erasing operation of the left bit. As a result, the programming and erasing operation of the right bit can be completed by making these changes.

The present invention uses a flash memory cell with a P-type semiconductor substrate as an example to explain the structural characteristic and the operation of the flash memory cell. An N-type semiconductor substrate can be substituted for the P-type semiconductor substrate in the present invention. In a flash memory cell with an N-type semiconductor substrate, the first ion-doped region and the diffusion drain are implanted with a P-type dopant, and the second ion-doped region is implanted with an N-type dopant. The structure of other elements and their corresponding positions are the same as those mentioned above, and will therefore not be described here. During the programming, erasing, or reading operation of a flash memory cell with an N-type semiconductor substrate, the operating voltages are opposite of those applied on the flash memory cell with the P-type semiconductor substrate. That is, during the operation of a flash memory cell with an N-type semiconductor substrate, the positive voltages and negative voltages applied on the flash memory cell with a P-type semiconductor substrate are translated into the negative voltages and positive voltages, respectively, and the zero-voltage, grounded-state and float-state are kept the same. As a result, the programming, erasing, and reading operation of the flash memory cell with the N-type semiconductor substrate can be completed.

The memory cell of the present invention does not alternate the source and the diffusion drain when reading the left bit and the right bit of a flash memory cell, thus simplifying the periphery circuits. The present invention effectively solves the problems appearing in the U.S. Pat. No. 6,011,725. That is, complexity and total area of periphery circuits are effectively reduced.

In addition, the memory cell of the present invention does not require field oxide layers or trench isolation layers in an array of two bit flash memory cells. Furthermore, it has advantages of simple fabrication, high density, and small area.

Those skilled in the art will readily observe that numerous modifications and alterations of the device may be made while retaining the teachings of the invention. Accordingly, the above disclosure should be construed as limited only by the metes and bound of the appended claims.

What is claimed is:

1. A method of programming, reading, and erasing a flash memory cell capable of storing two bits ("left" bit and "right" bit) of information, said flash memory cell comprising an embedded gate electrode formed in a trench of a substrate and isolated from said substrate by an ONO layer deposited on an interior surface of said trench, an N-type drain region located on surface of said substrate and next to said embedded gate electrode, an N-type source region located beneath said trench in said substrate and having a distance from said drain region, and left and right P-type doping regions formed, respectively, between said drain region and said source region on left and right sides of said embedded gate electrode in said substrate, the method comprising:

executing a programming process, comprising the steps of:
applying a negative word line voltage on said gate electrode;
applying a positive bit line voltage on said drain region;
grounding said source region and said first doping region; and
applying a negative voltage on said second doping region;

executing an erase process, comprising the steps of:
applying a positive word line voltage on said gate electrode;
floating said drain region;
grounding said source region and one of said first doped region and said second doped region; and
applying a negative voltage on the other one of said first doped region and said second doped region;

executing a read process, comprising the steps of:
applying a positive word line voltage on said gate electrode;
grounding said drain region and said first doping region;
applying a positive source line voltage that is lower than said word line voltage on said source region; and
applying a negative voltage on said second doping region.

2. The method of claim 1 wherein said drain region may be grounded during said erase process.

3. A method of programming, reading, and erasing a flash memory cell capable of storing two bits ("left" bit and "right" bit) of information, said flash memory cell comprising an embedded gate electrode formed in a trench of a substrate and isolated from said substrate by an ONO layer deposited on interior surface of said trench, a P-type drain region located on surface of said substrate and next to said embedded gate electrode, a P-type source region located beneath said trench in said substrate and having a distance from said drain region, and left and right N-type doped regions formed, respectively, between said drain region and said source region on left and right sides of said embedded gate electrode in said substrate, the method comprising:

executing a programming process, comprising the steps of:

applying a positive word line voltage on said gate electrode;

applying a negative bit line voltage on said drain region;

grounding said source region and said first doping region; and applying a positive voltage on said second doping region;

executing an erase process, comprising the steps of:

applying a negative word line voltage on said gate electrode;

floating said drain region;

grounding said source region and one of said first doping region and said second doping region; and applying a positive voltage on the other one of said first doping region and said second doping region;

executing a read process, comprising the steps of:

applying a negative word line voltage on said gate electrode;

grounding said drain region and said first doping region;

applying a negative source line voltage that is lower than said word line voltage on said source region; and applying a positive voltage on said second doping region.

4. The method of claim 3 wherein said drain region may be grounded during said erase process.

\* \* \* \* \*